(12) United States Patent
Hartmann et al.

(10) Patent No.: US 9,105,489 B2
(45) Date of Patent: Aug. 11, 2015

(54) POWER SEMICONDUCTOR MODULE

(71) Applicant: ABB TECHNOLOGY AG, Zürich (CH)

(72) Inventors: Samuel Hartmann, Staufen (CH);
Dominik Trüssel, Bremgarten (CH)

(73) Assignee: ABB TECHNOLOGY AG, Zürich (CH)

( * ) Notice: Subject to any disclaimer, the term of this patent is extended or adjusted under 35 U.S.C. 154(b) by 89 days.

(21) Appl. No.: 13/875,733

(22) Filed: May 2, 2013

(65) Prior Publication Data

US 2013/0292739 A1 Nov. 7, 2013

(30) Foreign Application Priority Data

May 2, 2012 (EP) .................................... 12166376

(51) Int. Cl.
  *H01L 29/66* (2006.01)
  *H01L 27/06* (2006.01)
  *H01L 25/07* (2006.01)
  *H01L 25/18* (2006.01)

(52) U.S. Cl.
  CPC ............ *H01L 27/067* (2013.01); *H01L 25/072* (2013.01); *H01L 25/18* (2013.01); *H01L 2924/0002* (2013.01)

(58) Field of Classification Search
  CPC .................. H01L 2924/00; H01L 2224/73265; H01L 2224/48227; H01L 2924/00014; H01L 2224/32225
  USPC ................... 257/139, 140, E21.383, E29.197
  See application file for complete search history.

(56) References Cited

U.S. PATENT DOCUMENTS

| 5,457,604 A | 10/1995 | Ando |
| 2006/0072261 A1 | 4/2006 | Bayerer et al. |
| 2008/0042164 A1* | 2/2008 | Kanschat ....................... 257/133 |
| 2010/0078675 A1 | 4/2010 | Kudo et al. |
| 2011/0204414 A1 | 8/2011 | Kopta et al. |
| 2011/0285459 A1 | 11/2011 | Uemura |
| 2012/0201272 A1* | 8/2012 | Schuler ......................... 374/183 |

FOREIGN PATENT DOCUMENTS

| EP | 2 184 781 A1 | 5/2010 |
| JP | 2002-368192 A | 12/2002 |
| JP | 2005-175074 A | 6/2005 |

OTHER PUBLICATIONS

Search Report issued on Oct. 10, 2012, by the European Patent Office for Application No. 12166376.9.
Lee, "Design Optimization of an Integrated Liquid-Cooled IGBT Power Module Using CFD Technique", IEEE Transactions on Components and Packaging Technologies, Mar. 2000, pp. 55-60, vol. 23, No. 1.

* cited by examiner

*Primary Examiner* — Andy Huynh
(74) *Attorney, Agent, or Firm* — Buchanan Ingersoll & Rooney PC (57) ABSTRACT

A power semiconductor module includes a base plate and at least one pair of substrates mounted on the base plate. Multiple power semiconductors are mounted on each substrate. The power semiconductors are arranged on each substrate with a different number of power semiconductors along opposite edges thereof. The at least one pair of substrates is arranged on the base plate with the respective edges of the substrates provided with a lower number of power semiconductors facing towards each other.

35 Claims, 4 Drawing Sheets

POWER SEMICONDUCTOR MODULE

RELATED APPLICATION

This application claims priority under 35 U.S.C. §119 to European Patent Application No. 12166376.9 filed in Europe on May 2, 2012, the entire content of which is hereby incorporated by reference in its entirety.

FIELD

The present disclosure relates to power semiconductor modules.

BACKGROUND INFORMATION

Power semiconductor modules are used in high power applications to switch high voltages and currents, and include multiple power semiconductors. Since each single semiconductor has a maximum voltage and current, the semiconductors have to be combined in parallel and/or in series within the power semiconductor module to enable their use in high power applications. To facilitate the manufacturing of such modules, they may include multiple substrates on which the power semiconductors are mounted. The substrates are provided with common contacts for emitter, collector and base contacts, so that the substrates can easily be connected in the power semiconductor modules. The substrates are mounted on a common base plate, which can be part of a housing of the power semiconductor module or which can be held within a housing of the power semiconductor module.

In known power semiconductor modules, four or six substrates may be combined, each provided with six power semiconductors including insulated gate bipolar transistors (IGBT), power diodes, reverse conducting insulated gate bipolar transistors (RC-IGBT), or other power semiconductors suitable for high power applications. The power semiconductors may be arranged in two rows on each substrate. For example, a substrate can include four IGBTs and two power diodes.

Important characteristics of a power semiconductor module are its size, heat generation, cooling and maximum power. To facilitate the use of power semiconductor modules, it is desired to provide modules with a compact size, which require little space for mounting, and which are capable of use with high currents. Due to the applied high power, power semiconductors generate an amount of heat which can damage the individual semiconductors or the entire power semiconductor module. It is also desired to achieve a good relation between maximum current and heat generation, so that the power semiconductor modules as a whole and all individual power semiconductors are not damaged during use. Therefore, it is also important to dissipate the heat generated in the power semiconductors within the module and away from the module.

SUMMARY

An exemplary embodiment of the present disclosure provides a power semiconductor module which includes a base plate, and at least one pair of substrates mounted on the base plate. Each substrate has a rectangular shape, and multiple power semiconductors are mounted on each substrate. The power semiconductors are arranged on each substrate with a different number of power semiconductors along opposite edges of the substrate. The at least one pair of substrates is arranged on the base plate with the respective edges of the substrates which are provided with a lower number of power semiconductors facing towards each other.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Exemplary embodiments of the present disclosure provide a power semiconductor module of the above-mentioned kind which enables use in high power applications with high currents, which shows improved temperature characteristics, and which is easily and economically mountable.

An exemplary embodiment of the present disclosure provides a power semiconductor module which includes a base plate and at least one pair of substrates mounted thereon. Each substrate has a rectangular shape, and multiple power semiconductors are mounted on each substrate. The power semiconductors are arranged on each substrate with a different number of power semiconductors along opposite edges thereof. The at least one pair of substrates is arranged on the base plate with the edges of the substrates provided with a lower number of power semiconductors facing towards each other. In other words, the substrates of the pair are arranged on the base plate with the edges of the substrates provided with a lower number of power semiconductors being next to each other and at least substantially parallel to each other.

An underlying concept of the present disclosure is to provide the power semiconductor module such that the power semiconductors are not equally spaced to achieve improved current/heat characteristics. Accordingly, along the edge provided with less power semiconductors, there is a space left which is not occupied with power semiconductors, and no heat is thereby generated in this space. Since the edges with the lower number of power semiconductors face each other, the number of power semiconductors at the center of the pair of substrates is reduced, resulting in reduced generation of heat in this area. This area in general refers to a central area of the power semiconductor module, and accordingly has a lower density of power semiconductors compared to other areas of the power semiconductor module. With less heat generated in the center of the module, a uniform temperature distribution can be achieved, so that the module as a whole is less susceptible to damages due to overheating of individual power semiconductors. Accordingly, the semiconductor power module can deal with increased current merely due to the placement of the substrates and the semiconductors thereon in accordance with the present disclosure.

In accordance with an exemplary embodiment of the present disclosure, the power semiconductor module includes two or three pairs of substrates. This results in a power semiconductor module which is suitable for high power applications having a small size. In accordance with an exemplary embodiment of the present disclosure, each substrate is provided with two rows of power semiconductors, one row arranged along each of the opposite edges of the substrate. The power semiconductor module can include additional semiconductors and/or substrates. In accordance with an exemplary embodiment of the present disclosure, the lower number of power semiconductors are located at the respective edges of the substrates so that the resulting gaps along these edges are displaced from each other. Heat from one substrate can be dissipated towards the opposite gap without heating another power semiconductor. In case different power semiconductors are used on the substrates, they may be arranged thereon so that power semiconductors generating less heat are arranged in the center of the opposite side walls. For example, the power semiconductors on the edge of the substrate facing the edge of another substrate may be arranged this way. Heat can be more easily dissipated from the corners of the substrate, so that a further improvement is achieved. The edges of the substrates not facing towards each other can more easily dissipate heat, since they are not surrounded by other power semiconductors.

According to an exemplary embodiment of the present disclosure, the opposite edges of the substrates are their longer edges. The rectangular shape of the substrates increases the degree of freedom for the design of the substrates and for the placement of the power semiconductors. With the longer edges being the opposite edges, a power semiconductor module with compact dimensions can be provided. With the longer edges of the substrates being the opposite edges, heat dissipation is of increased importance.

According to an exemplary embodiment of the present disclosure, the power semiconductors have a rectangular shape. The rectangular shape of the power semiconductors increases the degree of freedom for the design of the substrates and for placement of the power semiconductors. The rectangular shape allows for the arrangement of the power semiconductors with free spaces on the substrate according to the requirements, for example, for connection of different contacts on the substrate. In accordance with an exemplary embodiment of the present disclosure, the power semiconductors have the same size or at least approximately the same size. This allows to efficiently utilize the space available on the substrate.

According to an exemplary embodiment of the present disclosure, the power semiconductors arranged at the edge of the substrate provided with a higher number of power semiconductors are arranged with their longer lateral edges along this edge of the substrate, and the power semiconductors arranged at the edge of the substrate provided with a lower number of power semiconductors are arranged with their shorter lateral edges along this edge of the substrate. This design increases the size of a free space on the substrate along the edge provided with the lower number of power semiconductors.

According to an exemplary embodiment of the present disclosure, the substrate and the power semiconductors are provided so that the power semiconductors arranged at the edge of the substrate provided with a higher number of power semiconductors extend essentially along the entire length of this edge. This allows providing an optimized design of the substrate and the power semiconductor module. The entire length of the substrate along this edge is used for locating the power semiconductors, so that a compact substrate can be provided. Nevertheless, due to the lower number of power semiconductors along the other edge, sufficient space is available, for example, for a connection area of the substrate.

According to an exemplary embodiment of the present disclosure, the power semiconductors include at least one insulated gate bipolar transistor and at least one power diode. These power semiconductors are commonly used in power semiconductor modules and suitable for high power applications.

According to an exemplary embodiment of the present disclosure, the power semiconductors on each substrate include three insulated gate bipolar transistors and two power diodes. According to an exemplary embodiment of the present disclosure, each insulated gate bipolar transistor and each power diode has at least approximately the same size. Further, each power semiconductor may have a rectangular shape. This combination of power semiconductor devices provides a good relation between IGBT and diode performance, especially when using semiconductors of the same size. Due to improvements in the design of IGBTs, which have an increased efficiency, this relation of semiconductors provides optimized characteristics for a substrate and the power semiconductor module. Formerly, a combination of four IGBTs and two power diodes was widely used.

According to an exemplary embodiment of the present disclosure, one power diode and one insulated gate bipolar transistor are arranged along one of the opposite edges of the substrate, and one power diode and two insulated gate bipolar transistors are arranged along the other one of the opposite edges of the substrate. This enables an equally distributed heat generation on the substrate in all operation states. In accordance with an exemplary embodiment of the present disclosure, the power diodes and the IGBTs are positioned in such a way so that the power diodes and the IGBTs of the edges of the substrates facing each other are displaced. In accordance with an exemplary embodiment of the present disclosure, the power semiconductors are arranged due to the design and the usage of the substrate so that power semiconductors generating less heat are arranged in the center along the edges of the substrate.

According to an exemplary embodiment of the present disclosure, the power semiconductors are reverse conducting insulated gate bipolar transistors. A reverse conducting insulated gate bipolar transistor (RC-IGBT) is a combination of an insulated gate bipolar transistor and a power diode within a single semiconductor. RC-IGBTs can be provided with an optimum relation of power diode and IGBT by design of the single chip, thereby further improving the performance of the power semiconductor module.

According to an exemplary embodiment of the present disclosure, the power semiconductors are reverse conducting insulated gate bipolar transistors, each having a rectangular shape and at least substantially the same size.

According to an exemplary embodiment of the present disclosure, the substrates have an identical shape and design and are identically equipped with power semiconductors. One single type of substrates is used for power semiconductor modules, which facilitates the production and reduces the costs of power semiconductor modules. A pair of identical substrates is symmetrically arranged in respect to a center point between the pair of substrates, so that a rotation of 180° around this center point results in an identical arrangement of the substrates within the power semiconductor module. In accordance with an exemplary embodiment of the present disclosure, the power semiconductors have the same size.

According to an exemplary embodiment of the present disclosure, the at least one pair of substrates is arranged on the base plate with their edges along which a higher number of power semiconductors is provided facing towards borders of the base plate. The more power semiconductors are arranged along the edge of a substrate, the more heat is generated. The edges facing towards borders of the base plate are not surrounded by other power semiconductors, so that heat can be easily dissipated from these edges of the substrates.

According to an exemplary embodiment of the present disclosure, the distance between the edges of the substrates facing towards each other is smaller than the distance between each of the opposite edges of the substrates and borders of the base plate. Since little heat is generated in the center of a pair of substrates, the distance between the substrates can be even smaller than the distance between the substrates and the borders of the base plate. Hence, compact power semiconductor modules can be provided.

According to an exemplary embodiment of the present disclosure, each substrate has a connection area, which is located at a corner of the substrate next to the edge along which the lower number of power semiconductors is provided. The positioning of the connection area at the edge of the substrate allows for the design of a compact substrate. Space requirements in an area between the rows of semiconductors arranged along the opposite edges are reduced. The connection area includes contacts for collector, emitter and gate of the power semiconductors on the same substrate. In case power diodes are used, also the anode and cathode thereof are connected to the contacts of the substrate. In accordance with an exemplary embodiment of the present disclosure, the gate contact is surrounded by the emitter and collector contacts.

According to an exemplary embodiment of the disclosure, each substrate has a collector metallization provided in a U-shape, which extends along the opposite edges of the substrate and along one edge of the substrate connecting the opposite edges, whereby the collector metallization extends through the connection area. The power semiconductors are directly mounted on the collector metallization, thereby providing an electrically conducting connection between the collector metallization and the power semiconductors. For example, IGBTs are directly mounted with their collectors on the collector metallization. The collector metallization has a collector contact in the contact area.

According to an exemplary embodiment of the present disclosure, each substrate has an emitter metallization provided in an L-shape, which extends through the connection area and in an area between the power semiconductors arranged along the opposite edges of the substrate. The emitter metallization is close to all power semiconductors, so that they can be easily connected to the emitter metallization, for example, from their top side. In case of IGBTs, their emitters are connected to the emitter metallization. The power semiconductors may be bonded to the emitter metallization by means of bonding wires, for example. In accordance with an exemplary embodiment of the present disclosure, the emitter metallization is broadened in the connection area compared to the area between the power semiconductors to provide an emitter contact suitable for easily and reliably connecting the emitter metallization.

According to an exemplary embodiment of the present disclosure, each substrate has a gate metallization which includes a gate contact in the connection area, which is surrounded by the contacts of the collector and the emitter. The gate metallization may include, for example, a gate area, which is surrounded by the emitter metallization in the area between the power semiconductors arranged along the pair of opposite sides of the substrate According to an exemplary embodiment of the present disclosure, the power semiconductors having a gate are arranged on the substrate with their gates oriented to the center of the substrate. The gates can be bonded with short wires to the gate metallization.

According to an exemplary embodiment of the present disclosure, which can be combined with each of the other exemplary embodiments mentioned above, the power semiconductor module includes a plurality of pairs of substrates, and each pair of substrates is arranged on the base plate with the edges of the substrates of the pair provided with the lower number of power semiconductors facing towards each other.

According to an exemplary embodiment of the present disclosure, which can be combined with each of the other exemplary embodiments mentioned above, the power semiconductor module includes a plurality of pairs of substrates arranged on the base plate with the edges provided with the lower number of power semiconductors arranged along an axis of the module, for example, along a central axis of the module.

According to an exemplary embodiment of the present disclosure, the base plate has a rectangular shape.

Figure 1:
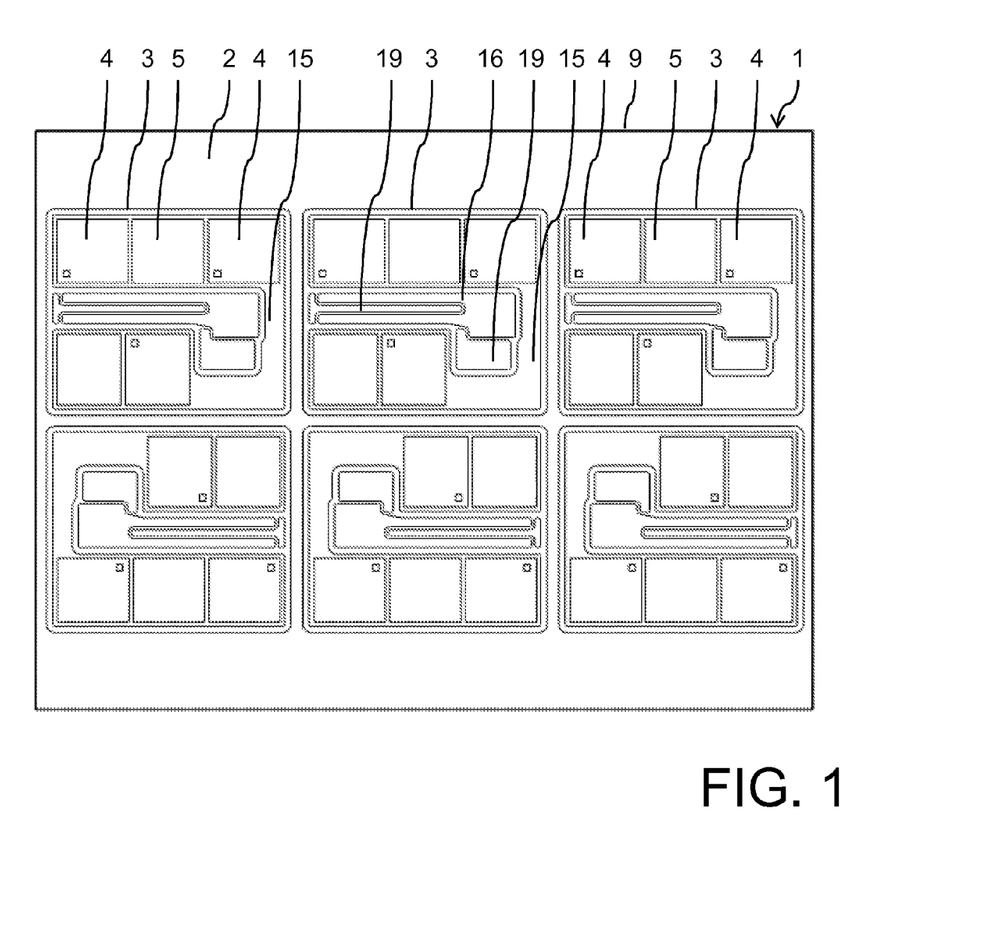
FIG. 1 shows a schematic drawing of a power semiconductor module according to an exemplary embodiment of the present disclosure.

FIG. 1 shows a power semiconductor module 1 according to an exemplary embodiment of the present disclosure. The power semiconductor module 1 includes a base plate 2 and three pairs of rectangular substrates 3 mounted thereon. As can be seen in FIG. 1 and will be further described below, all substrates 3 have an identical shape and design and are identically equipped with power semiconductors 4, 5. Each pair of identical substrates 3 is formed by two substrates 3, which are arranged with their longer edges 6 (see FIG. 2) facing each other, and are symmetrically arranged in respect to a center point between the pair of substrates 3, as will be further explained below.

Figure 2:
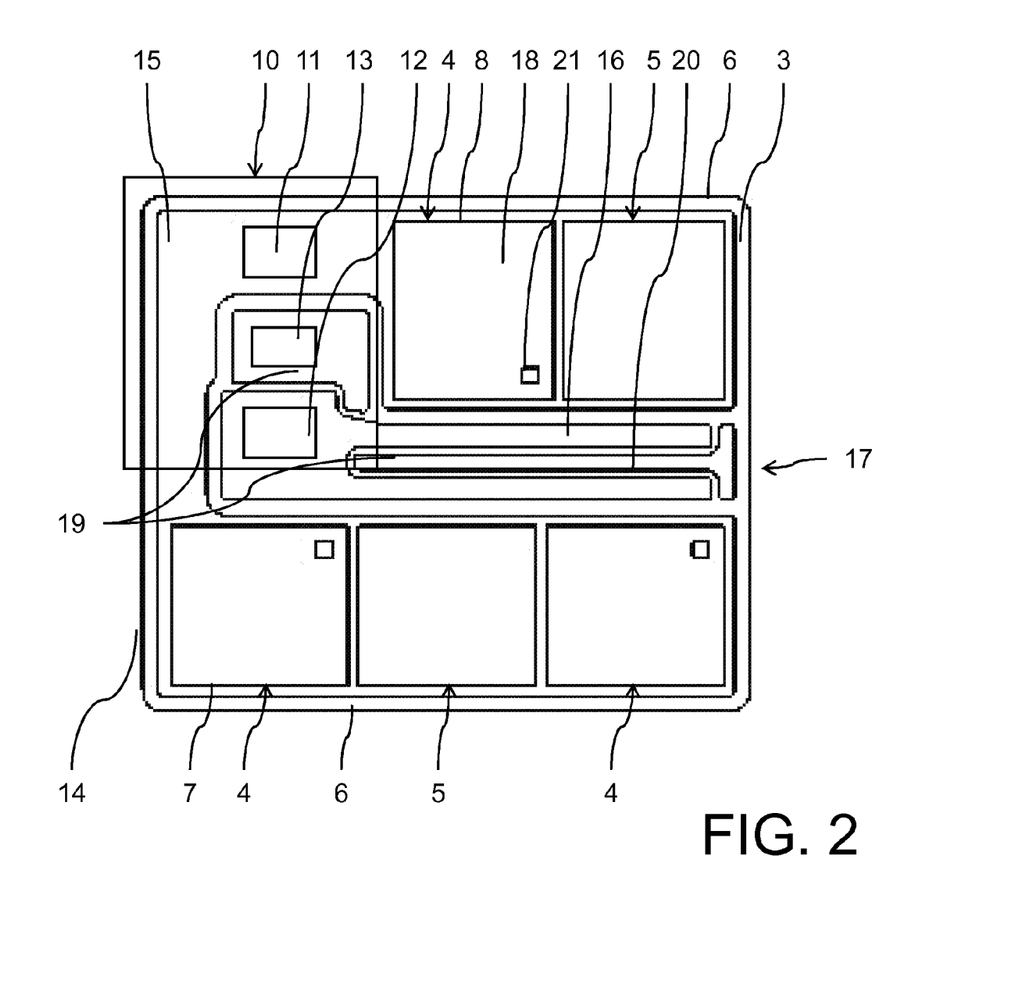
FIG. 2 shows a schematic drawing of a substrate of the power semiconductor module of FIG. 1.

As can be seen in FIG. 2 in detail, each substrate 3 is equipped with five power semiconductors 4, 5. All power semiconductors 4, 5 have the same rectangular shape and size and include three insulated gate bipolar transistors 4 (IGBT) and two power diodes 5, whereby one power diode 5 and one insulated gate bipolar transistor 4 are arranged next to each other along one of the longer edges 6 of the substrate 3, and one power diode 5 and two insulated gate bipolar transistors 4 are arranged in a row along the other one of the longer edges 6 of the substrate 3. As can be seen in FIG. 2, the power semiconductors 4, 5 located at the edge 6 of the substrate 3 provided with three power semiconductors 4, 5 are arranged with their longer lateral edges 7 along this edge 6 of the substrate 3 and extend essentially along the entire length of this edge 6. The power semiconductors 4, 5 arranged at the edge 6 of the substrate 3 provided with two power semiconductors 4, 5 are arranged with their shorter lateral edges 8 along this edge 6 of the substrate 3. The insulated gate bipolar transistors 4 are arranged on the substrate 3 with their gates 21 oriented to the center of the substrate 3.

As can be seen in FIG. 1, the three pairs of substrates 3 are arranged on the base plate 2 with the edges 6 of the substrates 3 along which two power semiconductors 4, 5 are provided facing towards each other. The opposite edges 6 face towards borders 9 of the base plate 2. The distance between the edges 6 of the substrates 3 facing towards each other is smaller than the distance between each of the opposite edges 6 of the substrates 3 and the borders 9 of the base plate 2. The power diodes 5 and the IGBTs 4 are positioned in such a way so that the power semiconductors 4, 5 of the edges 6 of the substrates 3 facing each other are displaced, when each pair of substrates 3 is positioned on the base plate 2 of the power semiconductor module 1.

As can be further seen in FIG. 2, each substrate 3 has a connection area 10, which is located at a corner of the substrate 3 next to the edge 6 along which the two power semiconductors 4, 5 are provided. The connection area 10 includes contacts 11, 12, 13 for the collector, emitter and gate, respectively, of the power semiconductors 4, 5 on the same substrate 3, whereby the gate contact 13 is surrounded by the emitter contact 12 and the collector contact 11. In case of the power diodes 5, the anode and cathode thereof are connected to the emitter contact 12 and the collector contact 11.

The substrate 3 includes a collector metallization 15, which is provided in a U-shape and extends along the opposite edges 6 of the substrate 3 and along one shorter edge 14 of the substrate 3 connecting the opposite edges 6. The collector metallization 15 further extends through the connection area 10. The power semiconductors 4, 5 are directly mounted on the collector metallization 15, thereby providing an electrically connection with the collector metallization 15. The collector contact 11 is part of the collector metallization 15 within the contact area 10.

The substrate 3 also includes an emitter metallization 16 provided in an L-shape, which extends through the connection area 10 and in an area 17 between the power semiconductors 4, 5 arranged along the opposite edges 6 of the substrate 3. The emitter metallization 16 is connected to emitters 18 of the insulated gate bipolar transistors 4 and the power diodes 5 by means of bonding wires, for example. The emitter metallization 16 is broadened in the connection area 10 compared to the area 17 between the power semiconductors 4, 5.

The substrate 3 also includes a gate metallization 19, which includes the gate contact 13 in the connection area 10 and a gate area 20, which is on three sides surrounded by the emitter metallization 16. The gate area 20 is connected to the gate contact 13 by means of at least one bonding wire, for example. Additionally, gates 21 of the insulated gate bipolar transistors 4 are connected to the gate area 20 by means of bonding wires, for example.

Consequently, the insulated gate bipolar transistors 4 are electrically parallel connected to each other. The power diodes 5 are electrically anti-parallel connected to the insulated gate bipolar transistors 4.

Figure 3:
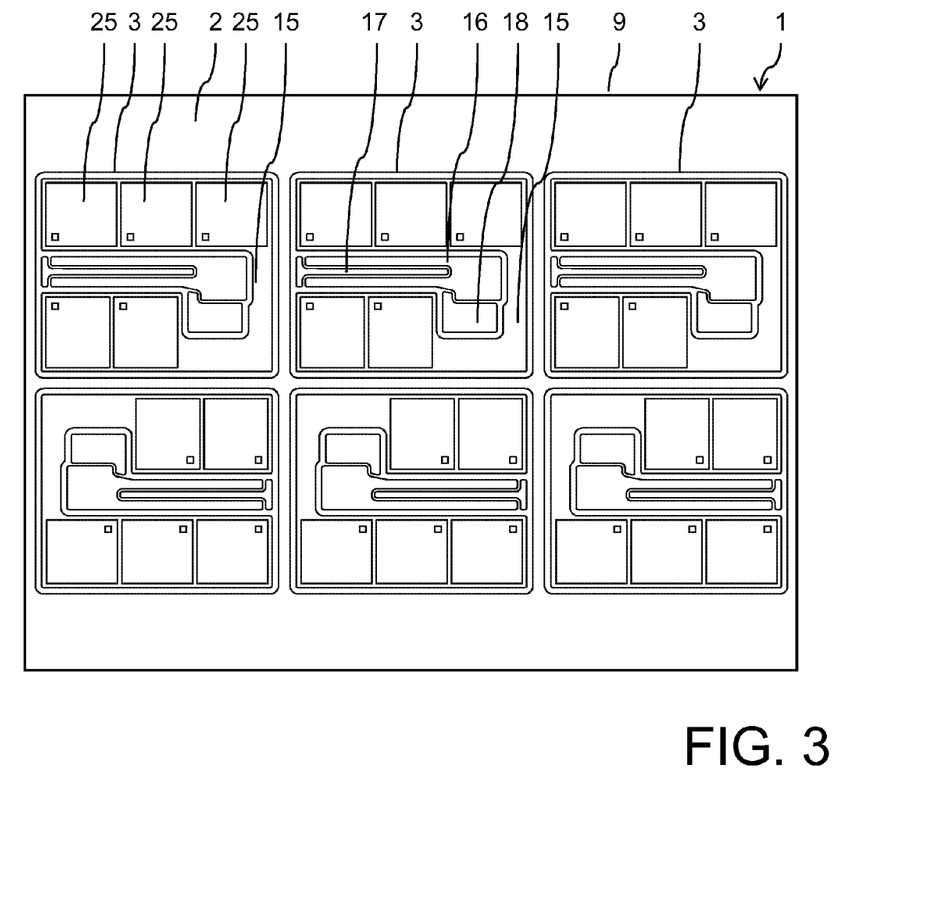
FIG. 3 shows a schematic drawing of a power semiconductor module according to an exemplary embodiment of the present disclosure.
Figure 4:
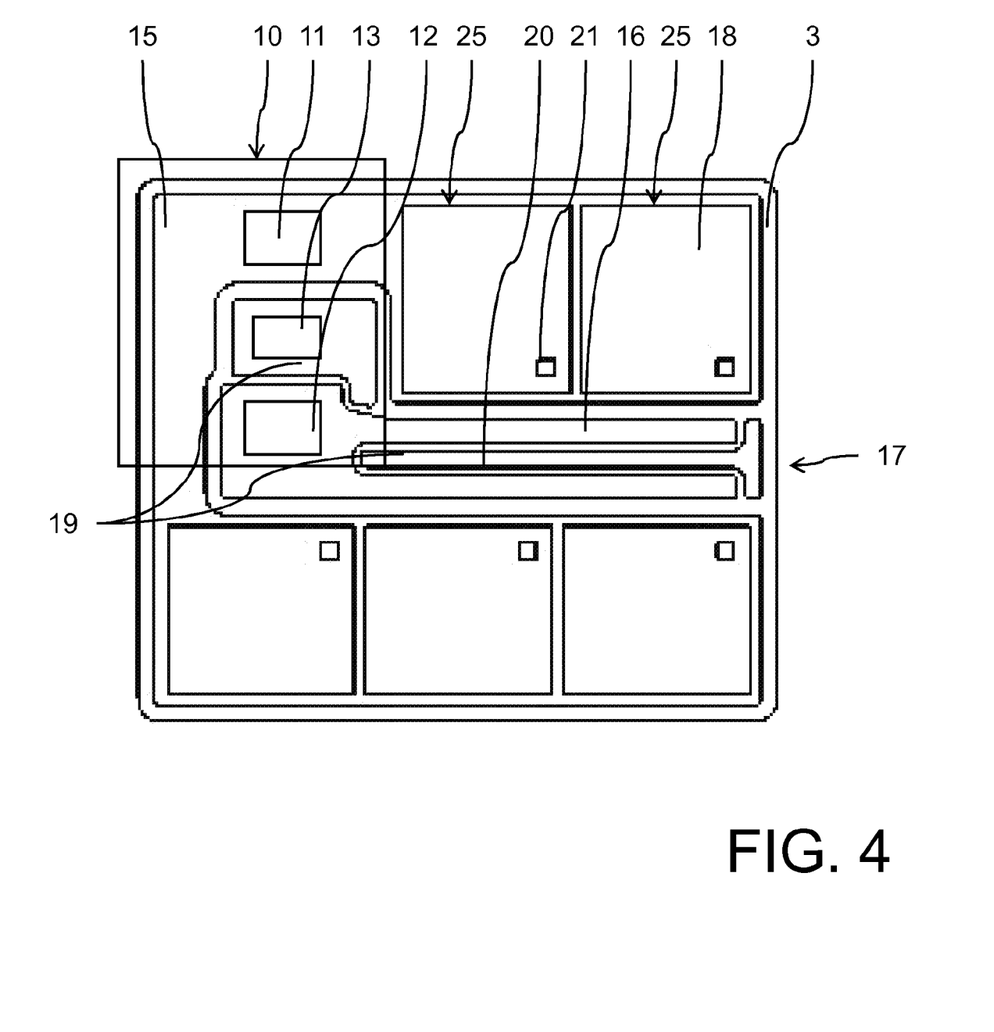
FIG. 4 shows a schematic drawing of a substrate of the power semiconductor module of FIG. 3.

According to an exemplary embodiment of the disclosure, which is shown in FIGS. 3 and 4, the substrate 3 is equipped with five identical reverse conducting insulated gate bipolar transistors 25 (RC-IGBT) as power semiconductors. Apart from this difference, the power semiconductor module 1 of the second embodiment is identical the module 1 illustrated with respect to FIGS. 1 and 2. In this case, the reverse conducting insulated gate bipolar transistors are parallel connected to each other.

While the present disclosure has been illustrated and described in detail in the drawings and foregoing description, such illustration and description are to be considered illustrative or exemplary and not restrictive. The present disclosure is not limited to the disclosed exemplary embodiments. Other variations to be disclosed exemplary embodiments can be understood and effected by those skilled in the art in practicing the claimed disclosure, from a study of the drawings, the disclosure, and the appended claims. In the claims, the word "comprising" or "including" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE SIGNS LIST 1 power semiconductor module
2 base plate
3 substrate
4 insulated gate bipolar transistor, power semiconductor
5 power diode, power semiconductor
6 longer edge of the substrate
7 longer edge of the power semiconductor
8 shorter edge of the power semiconductor
9 border
10 connection area
11 collector contact
12 emitter contact
13 gate contact
14 shorter edge of the substrate
15 collector metallization
16 emitter metallization
17 area
18 emitter
19 gate metallization
20 gate area
21 gate
25 reverse conducting insulated gate bipolar transistor, power semiconductor

What is claimed is:

1. A power semiconductor module comprising:
a base plate; and
at least one pair of substrates mounted on the base plate, wherein:
each substrate has a rectangular shape;
multiple power semiconductors are mounted on each substrate,
the power semiconductors are arranged on each substrate with a different number of power semiconductors along opposite edges of the substrate;
the at least one pair of substrates is arranged on the base plate with the respective edges of the substrates which are provided with a lower number of power semiconductors facing towards each other;
each substrate has a connection area, which is located at a corner of the substrate next to the edge along which the lower number of power semiconductors is provided; and
wherein each substrate has a collector metallization provided in a U-shape, which extends along the opposite edges of the substrates and along one edge of the substrate connecting the opposite edges, the collector metallization extending through the connection area.

2. The power semiconductor module according to claim 1, wherein the opposite edges of the substrates are the longer edges of the substrates.

3. The power semiconductor module according to claim 1, wherein the power semiconductors have a rectangular shape.

4. The power semiconductor module according to claim 3, wherein:
the power semiconductors arranged at the edge of the substrate which is provided with a higher number of power semiconductors are arranged with their longer lateral edges along this edge of the substrate; and
the power semiconductors arranged at the edge of the substrate which is provided with a lower number of power semiconductors are arranged with their shorter lateral edges along this edge of the substrate.

5. The power semiconductor module according to claim 4, wherein the substrate and the power semiconductors are provided so that the power semiconductors arranged at the edge of the substrate which is provided with a higher number of power semiconductors extend essentially along the entire length of this edge.

6. The power semiconductor module according to claim 1, wherein the power semiconductors are approximately of the same size.

7. The power semiconductor module according to claim 1, wherein the substrate and the power semiconductors are provided so that the power semiconductors arranged at the edge of the substrate which is provided with a higher number of power semiconductors extend essentially along the entire length of this edge.

8. The power semiconductor module according to claim 1, wherein the power semiconductors comprise at least one insulated gate bipolar transistor and at least one power diode.

9. The power semiconductor module according to claim 8, wherein:
one power diode and one insulated gate bipolar transistor are arranged along one of the opposite edges of the substrate; and
one power diode and two insulated gate bipolar transistors are arranged along the other one of the opposite edges of the substrate.

10. The power semiconductor module according to claim 8, wherein the power semiconductors on each substrate comprise three insulated gate bipolar transistors and two power diodes.

11. The power semiconductor module according to claim 1, wherein the power semiconductors on each substrate comprise three insulated gate bipolar transistors and two power diodes.

12. The power semiconductor module according to claim 1, wherein the power semiconductors are reverse conducting insulated gate bipolar transistors.

13. The power semiconductor module according to claim 1, wherein the substrates have an identical shape and design, and are identically equipped with power semiconductors.

14. The power semiconductor module according to claim 1, wherein the at least one pair of substrates is arranged on the base plate with their edges along which a higher number of power semiconductors is provided facing towards borders of the base plate.

15. The power semiconductor module according to claim 14, wherein a distance between the edges of the substrates facing towards each other is smaller than a distance between each of the opposite edges of the substrates and borders of the base plate.

16. The power semiconductor module according to claim 1, wherein each substrate has an emitter metallization provided in a L-shape, which extends through the connection area and in an area between the power semiconductors arranged along the opposite edges of the substrate.

17. The power semiconductor module according to claim 1, wherein the base plate has a rectangular shape.

18. The power semiconductor module according to claim 1, wherein the at least one pair of substrates are mounted directly on the base plate, and the multiple power semiconductors are mounted on directly on the corresponding substrate.

19. A power semiconductor module comprising:
a base plate; and
at least one pair of substrates mounted on the base plate, wherein:
each substrate has a rectangular shape;
multiple power semiconductors are mounted on each substrate,
the power semiconductors are arranged on each substrate with a different number of power semiconductors along opposite edges of the substrate;
the at least one pair of substrates is arranged on the base plate with the respective edges of the substrates which are provided with a lower number of power semiconductors facing towards each other;
each substrate has a connection area, which is located at a corner of the substrate next to the edge along which the lower number of power semiconductors is provided; and
each substrate has an emitter metallization provided in a L-shape, which extends through the connection area and in an area between the power semiconductors arranged along the opposite edges of the substrate.

20. The power semiconductor module according to claim 19, wherein the opposite edges of the substrates are the longer edges of the substrates.

21. The power semiconductor module according to claim 19, wherein the power semiconductors have a rectangular shape.

22. The power semiconductor module according to claim 21, wherein:
the power semiconductors arranged at the edge of the substrate which is provided with a higher number of power semiconductors are arranged with their longer lateral edges along this edge of the substrate; and
the power semiconductors arranged at the edge of the substrate which is provided with a lower number of power semiconductors are arranged with their shorter lateral edges along this edge of the substrate.

23. The power semiconductor module according to claim 22, wherein the substrate and the power semiconductors are provided so that the power semiconductors arranged at the edge of the substrate which is provided with a higher number of power semiconductors extend essentially along the entire length of this edge.

24. The power semiconductor module according to claim 19, wherein the power semiconductors are approximately of the same size.

25. The power semiconductor module according to claim 19, wherein the substrate and the power semiconductors are provided so that the power semiconductors arranged at the edge of the substrate which is provided with a higher number of power semiconductors extend essentially along the entire length of this edge.

26. The power semiconductor module according to claim 19, wherein the power semiconductors comprise at least one insulated gate bipolar transistor and at least one power diode.

27. The power semiconductor module according to claim 26, wherein:
one power diode and one insulated gate bipolar transistor are arranged along one of the opposite edges of the substrate; and
one power diode and two insulated gate bipolar transistors are arranged along the other one of the opposite edges of the substrate.

28. The power semiconductor module according to claim 26, wherein the power semiconductors on each substrate comprise three insulated gate bipolar transistors and two power diodes.

29. The power semiconductor module according to claim 19, wherein the power semiconductors on each substrate comprise three insulated gate bipolar transistors and two power diodes.

30. The power semiconductor module according to claim 19, wherein the power semiconductors are reverse conducting insulated gate bipolar transistors.

31. The power semiconductor module according to claim 19, wherein the substrates have an identical shape and design, and are identically equipped with power semiconductors.

32. The power semiconductor module according to claim 19, wherein the at least one pair of substrates is arranged on the base plate with their edges along which a higher number of power semiconductors is provided facing towards borders of the base plate.

33. The power semiconductor module according to claim 32, wherein a distance between the edges of the substrates facing towards each other is smaller than a distance between each of the opposite edges of the substrates and borders of the base plate.

34. The power semiconductor module according to claim 19, wherein the base plate has a rectangular shape.

35. The power semiconductor module according to claim 19, wherein the at least one pair of substrates are mounted directly on the base plate, and the multiple power semiconductors are mounted on directly on the corresponding substrate.

* * * * *